(12) United States Patent
Usvyatsky et al.

(10) Patent No.: US 10,019,317 B2
(45) Date of Patent: Jul. 10, 2018

(54) PARITY PROTECTION FOR DATA CHUNKS IN AN OBJECT STORAGE SYSTEM

(71) Applicant: Nexenta Systems, Inc., Santa Clara, CA (US)

(72) Inventors: Ilya Usvyatsky, Northborough, MA (US); Caitlin Bestler, Sunnyvale, CA (US); Dmitry Yusupov, Cupertino, CA (US)

(73) Assignee: Nexenta Systems, Inc., Santa Clara, CA (US)

( * ) Notice: Subject to any disclaimer, the term of this patent is extended or adjusted under 35 U.S.C. 154(b) by 127 days.

(21) Appl. No.: 15/137,920

(22) Filed: Apr. 25, 2016

(65) Prior Publication Data

US 2017/0308437 A1 Oct. 26, 2017

(51) Int. Cl.
| | | |
|---|---|---|
| G06F 11/10 | (2006.01) | |
| G06F 11/14 | (2006.01) | |
| H03M 13/15 | (2006.01) | |
| H04L 29/08 | (2006.01) | |

(52) U.S. Cl.
CPC ...... *G06F 11/1092* (2013.01); *G06F 11/1435* (2013.01); *G06F 11/1453* (2013.01); *H03M 13/1505* (2013.01); *H04L 67/1095* (2013.01); *H04L 67/1097* (2013.01)

(58) Field of Classification Search
CPC . G06F 11/092; G06F 11/1435; G06F 11/1453
USPC ....................................................... 714/52
See application file for complete search history.

(56) References Cited

U.S. PATENT DOCUMENTS

| | | | | |
|---|---|---|---|---|
| 8,131,924 B1* | 3/2012 | Frandzel | ............... | G06F 3/0608 711/111 |
| 8,868,505 B1* | 10/2014 | Jayanthi | ................ | H04L 63/123 707/640 |
| 9,338,019 B2* | 5/2016 | Bestler | .................... | G06F 17/30 |
| 9,479,587 B2* | 10/2016 | Bestler | .................... | G06F 17/30 |
| 9,710,535 B2* | 7/2017 | Aizman | ............ | G06F 17/30578 |
| 9,747,319 B2* | 8/2017 | Bestler | .................... | G06F 3/067 |
| 2007/0276836 A1* | 11/2007 | Chatterjee | ......... | G06F 17/30194 |
| 2012/0159067 A1* | 6/2012 | Kelton | ................ | G06F 11/1076 711/113 |
| 2012/0159070 A1* | 6/2012 | Baderdinni | ......... | G06F 11/1076 711/114 |
| 2012/0331249 A1* | 12/2012 | Benjamin | ............. | G06F 3/0607 711/162 |
| 2014/0025948 A1* | 1/2014 | Bestler | .................. | H04L 9/0863 713/167 |
| 2014/0059333 A1* | 2/2014 | Dixon | ................... | G06F 9/3004 712/244 |
| 2014/0164694 A1* | 6/2014 | Storer | ................. | G06F 11/1092 711/114 |
| 2014/0229455 A1* | 8/2014 | Bestler | .............. | G06F 17/30159 707/695 |

(Continued)

*Primary Examiner* — Kamini B Patel
(74) *Attorney, Agent, or Firm* — DLA Piper LLP (US)

(57) ABSTRACT

The present invention relates to a method and system for providing parity protection in an object storage system. The present invention allows for tracking the storage requirements for chunks in a distributed storage cluster when transitioning from replica-based protection to parity or erasure coding-based protection and when transitioning from parity or erasure coding-based protection to replica-based protection.

15 Claims, 15 Drawing Sheets

(56) References Cited

U.S. PATENT DOCUMENTS

| | | | | |
|---|---|---|---|---|
| 2015/0227757 A1* | 8/2015 | Bestler | ................ | G06F 21/6227 713/167 |
| 2015/0288754 A1* | 10/2015 | Mosko | ................ | H04L 67/1095 709/248 |
| 2015/0288755 A1* | 10/2015 | Mosko | ................ | H04L 67/1095 709/248 |
| 2016/0205190 A1* | 7/2016 | Bestler | .............. | G06F 17/30312 709/217 |
| 2017/0123931 A1* | 5/2017 | Aizman | .............. | G06F 11/1448 |

* cited by examiner parity protection content manifest
810 for each manifest (such as manifest 710):
- one or more parity protection sets (such as parity protection set 701)
- for each parity protection set (such as parity protection set 701)
  • protection algorithm 910
  • source chunk references 920
  • parity chunk references 930

4 Chunks with Replica Protection

| Replica 1 | Replica 2 | Replica 3 |
|---|---|---|
| C0 FD 17 | C0 FD 53 | C0 FD 87 |
| C1 FD 19 | C1 FD 48 | C1 FD 92 |
| C2 FD 23 | C2 FD 43 | C2 FD 73 |
| C3 FD 24 | C3 FD 59 | C3 FD 79 |

4 Chunks with 2 Parity Protection

| Single Replica |
|---|
| C0 FD 17 (replicas in FD 53, 87 may be expunged) |
| C1 FD 48 (replicas in FD 19, 92 may be expunged) |
| C2 FD 43 (replicas in FD 23, 73 may be expunged) |
| C3 FD 79 (replicas in FD 24, 59 may be expunged) |
| P(C0,C1,C2,C3) in FD 19 |
| Q(C0,C2,C2,C3) in FD 63 |

PARITY PROTECTION FOR DATA CHUNKS IN AN OBJECT STORAGE SYSTEM

TECHNICAL FIELD

The present invention relates to a method and system for providing parity protection in an object storage system. The present invention allows for tracking the storage requirements for chunks in a distributed storage cluster when transitioning from replica-based protection to parity or erasure coding-based protection and when transitioning from parity or erasure coding-based protection to replica-based protection.

BACKGROUND OF THE INVENTION

This application builds upon the inventions by Applicant disclosed in the following patents and applications: U.S. patent application Ser. No. 14/095,839, which was filed on Dec. 3, 2013 and titled "SCALABLE TRANSPORT SYSTEM FOR MULTICAST REPLICATION"; U.S. patent application Ser. No. 14/095,843, which was filed on Dec. 3, 2013 and titled "SCALABLE TRANSPORT SYSTEM FOR MULTICAST REPLICATION"; U.S. patent application Ser. No. 14/095,848, which was filed on Dec. 3, 2013 and titled "SCALABLE TRANSPORT WITH CLIENT-CONSENSUS RENDEZVOUS"; U.S. patent application Ser. No. 14/095,855, which was filed on Dec. 3, 2013 and titled "SCALABLE TRANSPORT WITH CLUSTER-CONSENSUS RENDEZVOUS"; U.S. patent application Ser. No. 14/312,282, which was filed on Jun. 23, 2014 and titled "Key/value storage device and method" (the "KVM Encoding Patent Application"); and U.S. patent application Ser. No. 14/820,471, which was filed on Aug. 6, 2015 and titled "Object Storage System with Local Transaction Logs, A Distributed Namespace, and Optimized Support for User Directories" (the "Local Transaction Log Patent Application"). All of the above-listed applications and patents are incorporated by reference herein and referred to collectively as the "Incorporated References."

a. A Replicast Storage System

With reference now to existing relevant art developed by Applicant, FIG. 1 depicts storage system 100 described in the Incorporated References. Storage system 100 comprises clients 110a, 110b, . . . 110i (where i is any integer value), which access initiator/application layer gateway 130 over client access network 120. It will be understood by one of ordinary skill in the art that there can be multiple gateways and client access networks, and that gateway 130 and client access network 120 are merely exemplary. Gateway 130 in turn accesses replicast network 140, which in turn accesses storage servers 150a, 150b, 150c, 150d, . . . 150k (where k is any integer value). Each of the storage servers 150a, 150b, 150c, 150d, . . . , 150k is coupled to a plurality of storage devices 160a, 160b, . . . 160k, respectively.

In this patent application the terms "initiator", "application layer gateway", or simply "gateway" refer to the same type of devices and are used interchangeably.

FIG. 2 depicts a typical put transaction in storage system 100 to store chunk 220. As discussed in the Incorporated References, groups of storage servers are maintained, which are referred to as "negotiating groups." Here, exemplary negotiating group 210a is depicted, which comprises ten storage servers, specifically, storage servers 150a-150j. When a put command is received, gateway 130 assigns the put transaction to a negotiating group. In this example, the put chunk 220 transaction is assigned to negotiating group 210a. It will be understood by one of ordinary skill in the art that there can be multiple negotiating groups on storage system 100, and that negotiating group 210a is merely exemplary, and that each negotiating group can consist of any number of storage servers and that the use of ten storage servers is merely exemplary.

Gateway 130 then engages in a protocol with each storage server in negotiating group 210a to determine which three storage servers should handle the put request. The three storage servers that are selected are referred to as a "rendezvous group." As discussed in the Incorporated References, the rendezvous group comprises three storage servers so that the data stored by each put transaction is replicated and stored in three separate locations, where each instance of data storage is referred to as a replica. Applicant has concluded that three storage servers provide an optimal degree of replication for this purpose, but any other number of servers could be used instead.

In varying embodiments, the rendezvous group may be addressed by different methods. All of which achieve the result of limiting the entities addressed to the subset of the negotiating group identified as belonging to the rendezvous group. These methods include:

Selecting a matching group from a pool of pre-configured multicast groups each holding a different subset combination of members from the negotiating group;

Using a protocol that allows each UDP message to be addressed to an enumerated subset of the total group. An example of such a protocol would be the BIER protocol currently under development by the IETF; and Using a custom control protocol which allows the sender to explicitly specify the membership of a target multicast group as being a specific subset of an existing multicast group. Such a control protocol was proposed in an Internet Draft submitted to the IETF titled "Creation of Transactional Multicast Groups" and dated Mar. 23, 2015, a copy of which is being submitted with this application and is incorporated herein by reference.

In FIG. 3, gateway 130 has selected storage servers 150b, 150e, and 150g as rendezvous group 310a to store chunk 220.

In FIG. 4, gateway 130 transmits the put command for chunk 220 to rendezvous group 310a. This is a multicast operation. In this example, three replicas of chunk 220 will be stored (labeled as replicas 401a, 401b, and 401c).

b. Mechanisms to Recover Data When Disk Drives Fail

In a well-known aspect of the prior art, storage servers such as storage servers 150a . . . 150k often utilize physical disk drives. However, disk drives are unreliable. They break. The connections to them break. The servers that access them break. For a storage cluster containing a significant number of disk drives, drive failures are predictable routine events, not exceptional errors. Having a single persistently stored copy of some data does not mean that the data is saved persistently. It is only safe until something loses or blocks access to that replica.

There are several prior art strategies to ensure that data is truly saved persistently. These include creating multiple whole replicas of the data, RAID encoding, and Erasure Coding. Each of these strategies increases the probability of successfully retaining data higher compared to a system that retains only a single replica or slice.

All of these data protection methods can be characterized by the number of slices or chunks being protected (N) and the number of additional slices or chunks that protect the data (M). The total size written is N+M, and the data for any N of the slices can be recovered. The different methods vary in how much overhead is required (the ratio of M to N) and the complexity of creating and using the parity protection data.

c. Replica System

An example of a prior art replica system 500 is shown in FIG. 5. Replica system 500 comprises drive array 510. In this example, drive array 510 comprises three drives (Drive 1, Drive 2, and Drive 3). Each data block that is written as part of a put command is stored once in each drive. Thus, when block $A_1$ is stored, it is stored three times, once in each drive. Creating three whole replicas is a 1:2 scheme. There are three total chunks (1+2), any one of which can recover the original (since each drive stored an exact copy of the original).

d. RAID System

Parity-based protection was introduced in late 1980s to early 1990s with the invention of RAID—redundant array of inexpensive disks. An example of one type of prior art RAID system is shown in FIG. 6. Here, RAID-4 system 600 comprises drive array 610. In this example, drive array 610 comprises N drives (Drive 1, Drive 2, . . . Drive N) that store data and one drive (Drive P) that stores parity. Here, data is written in stripes to drive array 610. One example of a stripe is stripe 601. The data is written into blocks $A_1$ on Drive 1, $A_2$ on Drive 2, . . . and $A_N$ on Drive N. From these blocks, a parity block, $A_P$, is calculated and stored on Drive P. Numerous methods are known in the prior art for calculating parity. The simplest method is to perform an "XOR" operation on the data to be protected, and to store the result as the parity bit. In the example of FIG. 6, if the XOR method is used, the first bit in each of $A_1 \ldots A_N$ would be XOR'd, and the result would be stored in the first bit location of block $A_P$. The same action would be performed on all remaining bits in the blocks. Additional parity drives (Drive P+1, etc.) can be used if it is desired to make RAID-4 system 600 even more robust against drive failures. Other RAID schemes, such as RAID-5 and RAID-6 are well known.

RAID was introduced as a hardware concept, but has been extended to software RAID solutions such as RAID-Z used in the ZFS storage system developed by Sun Microsystems. Simple RAID-5 or any of its software equivalents like RAID-Z is a N:1 scheme where N data slices are protected by a single parity slice. RAID-6 is an N:2 scheme.

Protection from loss of more than a single drive is provided in RAID-Z2 and RAID-Z3 through the addition of up to two extra parity calculations (Galois transformations dubed "q" and "r" supplement the simple XOR algorithm dubbed "p"). These extra algorithms can recover 2 or 3 lost chunks respectively. Simple XOR parity as in the example described above can only recover from a single loss (i.e., the failure of one drive in the stripe group).

U.S. Pat. No. 8,316,260 (Bonwick) discloses multidimensional RAID which combines additional parity calculations (as from RAID-Zn) with including the same chunk in multiple parity calculations to protect against the loss of multiple drives. Each row or column in an array can provide RAID Zn protection, allowing protection from many lost drives.

RAID techniques that rely on simple XOR calculations for parity can use parallel calculations. This is described in the 1989 TickerTAIP paper, and fully distributed algorithms as described in RADD (Redundant Array of Distributed Drives).

U.S. Pat. No. 6,289,415 (Johnson) discloses asynchronous generation of RAID-style parity protection, but does not combine this with any alternate form of protection before parity generation is completed. The market targeted for this technique was creation of tape archives. The goal of asynchronous parity generation was to avoid the need for synchronized tape drives rather than to complete transactions without waiting for parity generation.

e. Erasure Coding

Erasure coding schemes offer fully configurable amounts of protection (M can be larger than 2), but require more sophisticated algorithms than simple XOR. This results in a system that costs more than would be required for other techniques.

Most existing solutions use erasure coding systems when protection against more than 3 simultaneous failures is needed. Erasure coding techniques use more complex algorithms such as Reed-Solomon or Cauchy derivatives to generate N checksum slices based upon M slices of data.

f. Parity Protection Costs and Trade-Offs Analysis

Additional processing power is required for any parity protection mechanism, but modern processing speeds minimize this cost.

There is a trade-off between transactional latency and the storage overhead required to achieve a given level of data protection. A transactional latency penalty results from network transmission times and being dependent on the worst case disk seek times from more drives.

With parity protection, slices with 1/Nth of the payload must be written to N+M storage servers. With replica protection, whole replicas must be written to 1+M storage servers each. However, if multicast delivery is used, the whole replicas can be written in parallel with only a single network delivery, thus minimizing the transmission latency.

A complete transaction requires transmitting the data to each target server, having the target server seek to the write location, and then writing the payload.

The probable time to put N+M slices under a parity approach versus M whole replicas under a replica approach compares as follows:

| | Writing N + M Slices | Writing 1 + M Replicas |
|---|---|---|
| Network Transmission time | (N + M)/N | 1 + M (unicast) 1 (multicast) |
| Disk Queuing time for target availability and disk seek. | Worst of N + M | Worst of 1 + M |
| Actual Disk Write each target | 1/N | 1 |

With the exception of the actual write times, creating whole replicas in a multicast system is faster. The maximum latency for N+M slices will never be less than for 1+M replicas. Multicast delivery only requires sending the payload once, as opposed to the overhead of sending an additional M/Nth of the payload with erasure coding.

While it would be possible to multicast a payload chunk and have some targets use the received payload to create parity protection chunks, there are no obvious methods to plan or track which parity chunks were protecting which payload chunks. Therefore, it is advantageous for a storage cluster using multicast replication to put new content as whole replicas.

Newly created content is also more likely to be retrieved, and its retrieval also benefits from using whole replicas. Having extra copies reduces the queuing delay to retrieve one of the copies. Further, only a single storage server needs to be scheduled to retrieve any given chunk.

However, eventually the relative benefits of whole replicas fade and are outweighed by the space savings of parity protection. That is, a replica scheme generally requires greater storage space than a parity scheme.

What is lacking in the prior art is the ability to utilize a replica scheme when data is first stored and while the data remains "hot" (frequently accessed) but to switch to a parity scheme when the data is no longer needed as frequently and has become "cold" (infrequently accessed), thus increasing the amount of available storage by freeing up the space previously occupied by replicas that are no longer needed. The ability to switch back from "cold" status to "hot" status is also needed, for instance, if the frequency of access to the data increases. Preferably, a solution would retain relevant portions of the prior encoding scheme to minimize the total amount of disk writes required for either transition.

SUMMARY OF THE INVENTION

The present invention utilizes replicas when data is hot and parity when data has become cold. Cold content can be shifted from replica protection to parity protection using background processing, thus reducing the storage overhead by reclaiming the space used by now excessive replicas. Should the data become hot again, the system can shift from parity protection back to replica protection. Either shift does not require moving existing data chunks.

Algorithms for adding parity protection data to existing data are straightforward applications of classic error detection algorithms that have been around for many decades. Simply adding parity protection, however, would be of minimal value unless the system reduced the number of whole replicas required. This is a particular challenge with a fully distributed storage cluster, as in the Incorporated References, when there is no central repository tracking the retention requirements for each chunk.

The present invention discloses a method of updating the distributed back-references (which control chunk retention) in conjunction with the creation of parity chunks and parity protection manifests. Back-references as disclosed in the Incorporated References exist for each manifest referencing a payload chunk and additionally encode the replication requirement imposed on the chunk by the referencing manifest. The present invention extends the encoding of a back-reference to support parity protection.

Additionally, the present invention comprises a system and method for backward conversion from a parity scheme to a replica scheme.

BRIEF DESCRIPTION OF THE DRAWINGS

FIG. 9 illustrates the information encoded in a parity protection content manifest.

FIG. 10 illustrates the transformation from 3 replicas each of 4 chunks to retention of a single replica of each of the original 4 chunks with the addition of 2 chunks in different failure domains.

DETAILED DESCRIPTION OF THE PREFERRED EMBODIMENTS

The present invention is a technique to properly maintain back-references from payload chunks to a manifest in a distributed storage cluster concurrent with "manifest striping" of the content. As disclosed in the Incorporated References, each back-reference encodes the need for a specific chunk replica to be retained because it is referenced by a specific manifest. A chunk replica that is not referenced by any manifest is no longer needed and may be deleted. In the Incorporated References each back-reference also encodes the replication count required of the payload chunk by the specific manifest.

"Manifest striping" is the technique for generating parity chunks to protect payload chunks that already exist and are referenced by one or more manifests, especially manifests representing a range of versions of an object.

Figure 1:
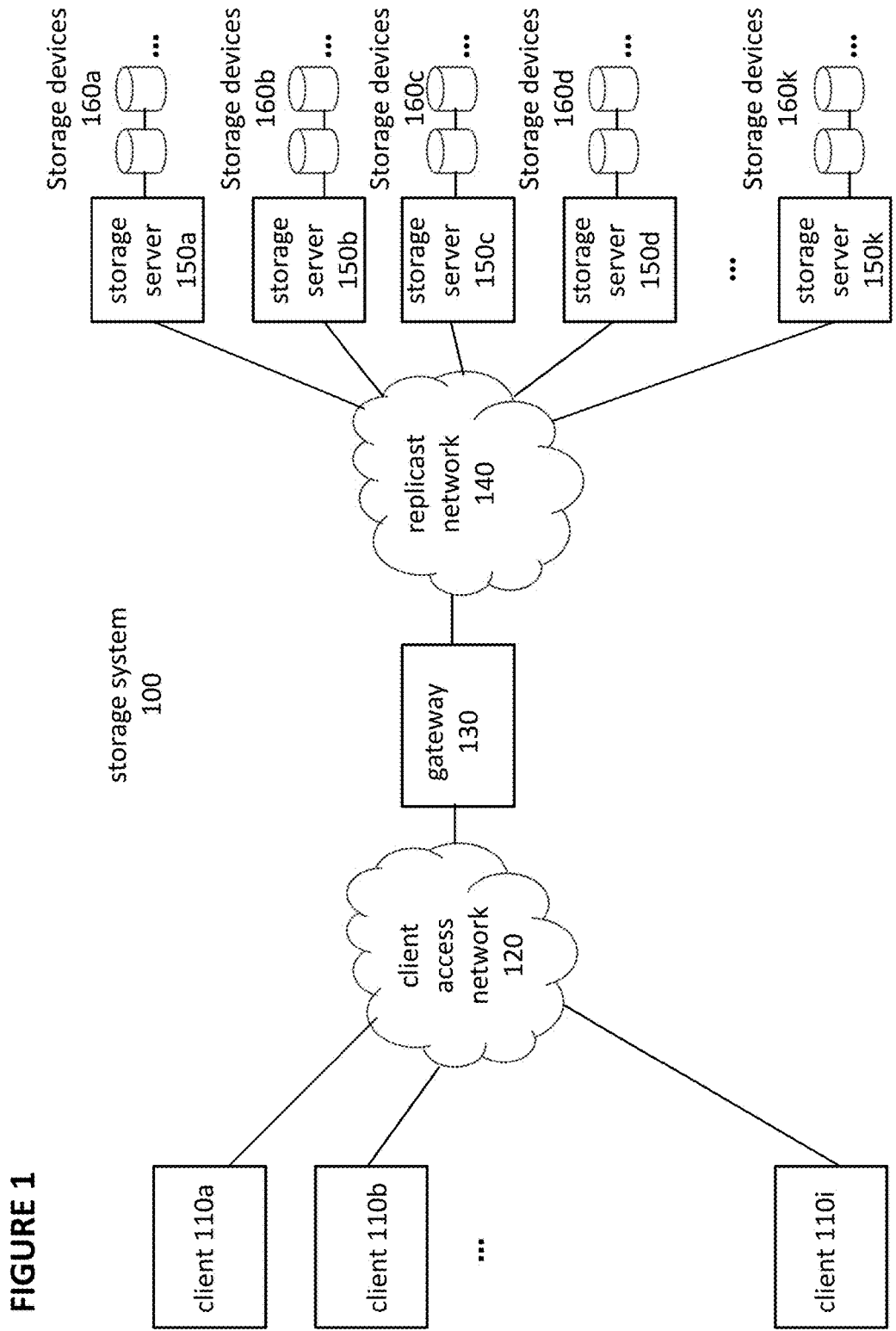
FIG. 1 depicts a storage system described in the Incorporated References.
Figure 2:
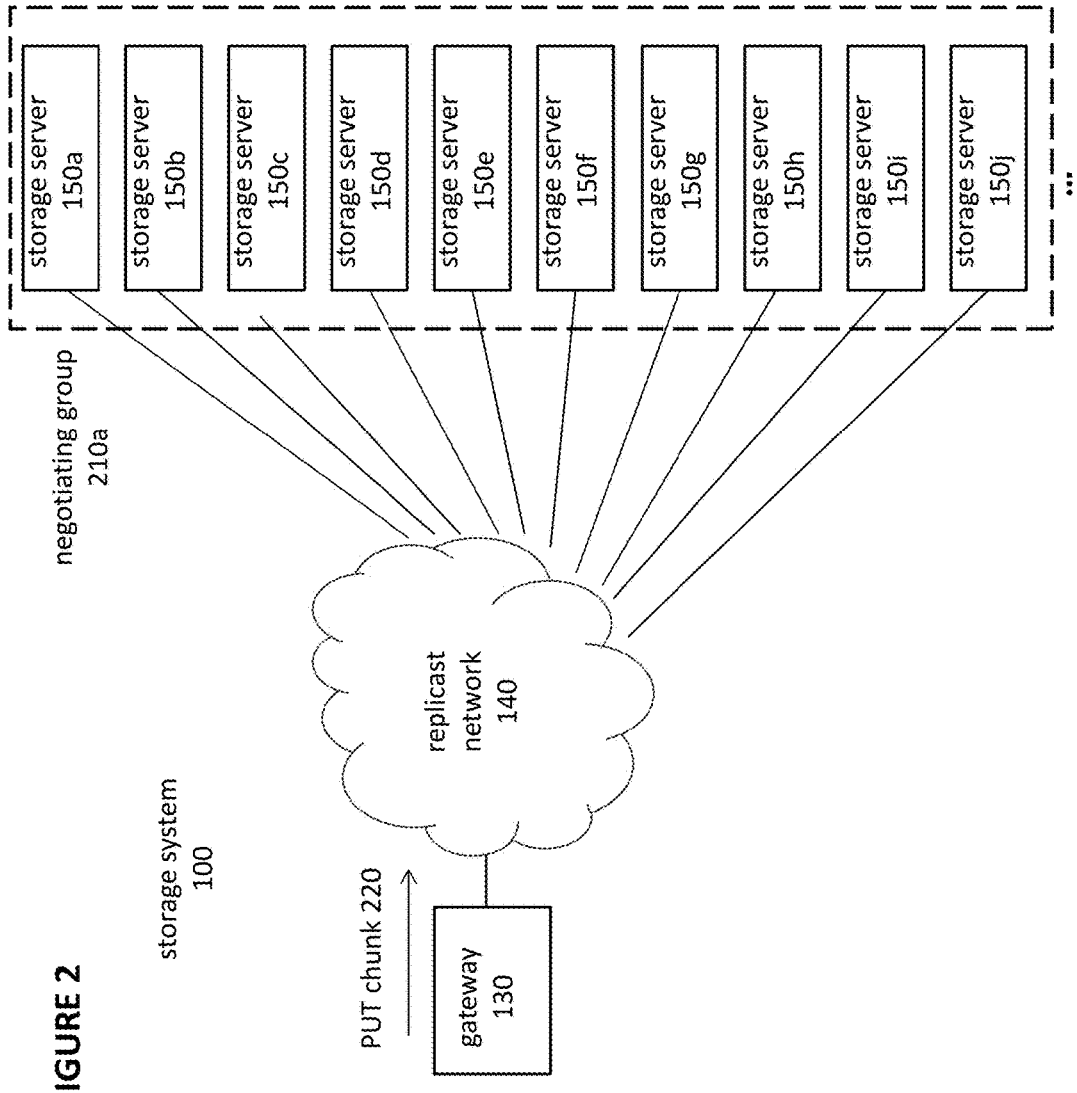
FIG. 2 depicts a negotiating group comprising a plurality of storage servers.
Figure 3:
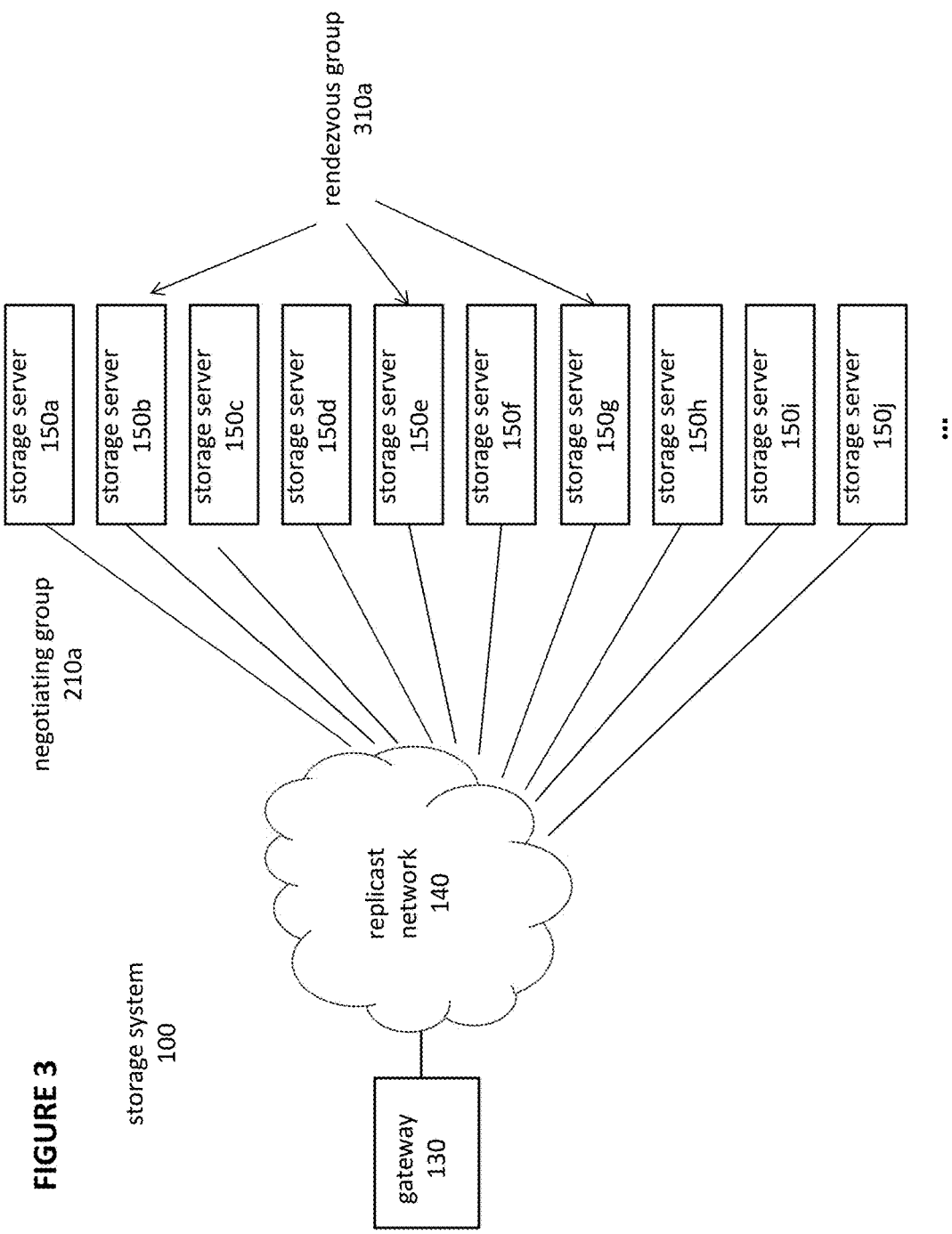
FIG. 3 depicts a rendezvous group formed within the negotiating group.
Figure 4:
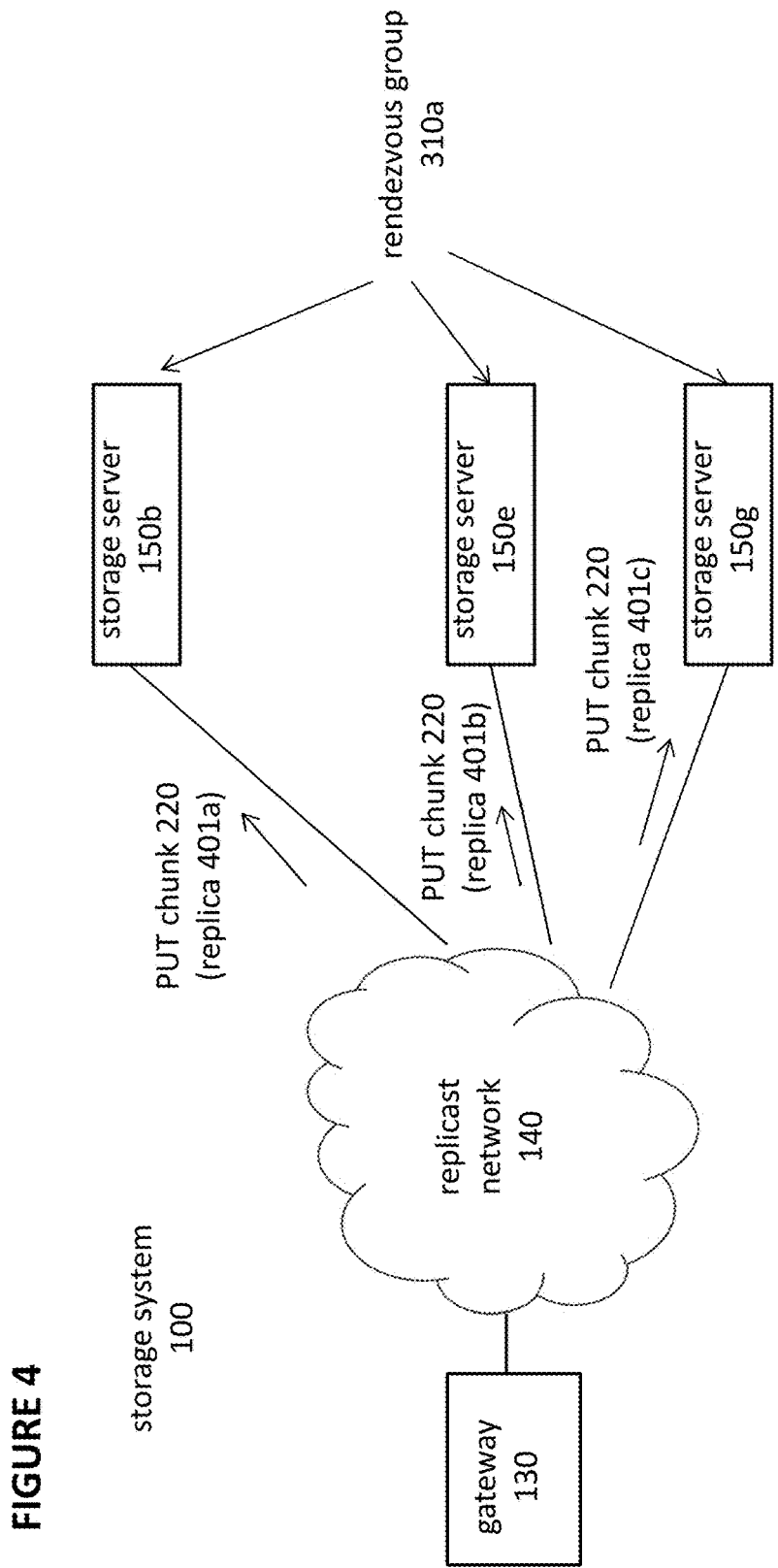
FIG. 4 depicts a put transaction of a chunk to the rendezvous group.
Figure 5:
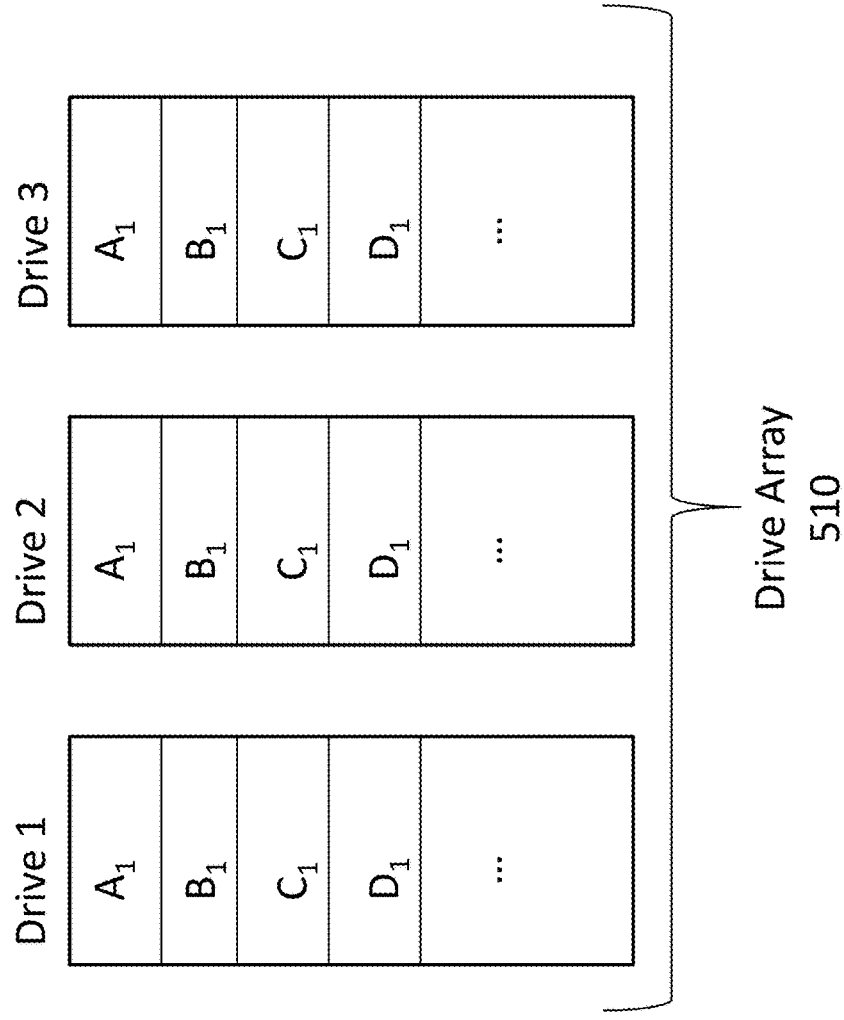
FIG. 5 depicts a prior art replica system.
Figure 6:
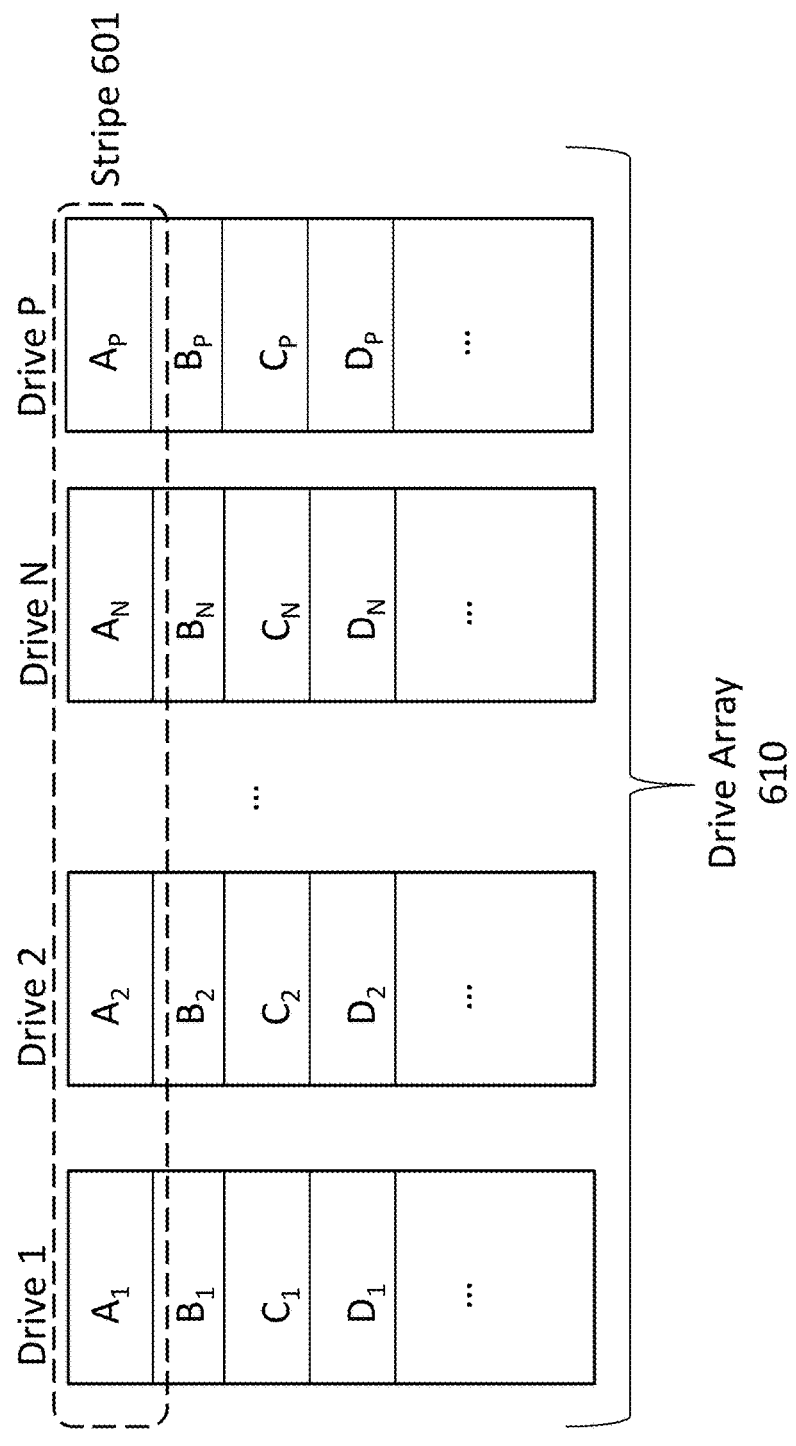
FIG. 6 depicts a prior art RAID-4 parity system.

Manifest striping can be thought of as generating parity protection by "vertically striping" the content. Most prior art schemes, such as the one shown in FIG. 5, horizontally stripe the data. For example, a 16 KB block is encoded as eight 2 KB stripes and then M 2 KB parity stripes are added to the set. Payload data is protected in conjunction with "nearby" data. With manifest striping, data is more typically protected in conjunction with data that is "far," an entire chunk size, away. Conventional striping strategies applied ex post facto to already chunked data would take optimally sized chunks and re-write multiple stripes that were less than the optimal size. This also requires the already chunked data to be read and then re-written disk along with the parity data. By contrast, manifest striping leaves the chunks at their optimal size and generates parity protection covering the pre-existing chunks.

Figure 7:
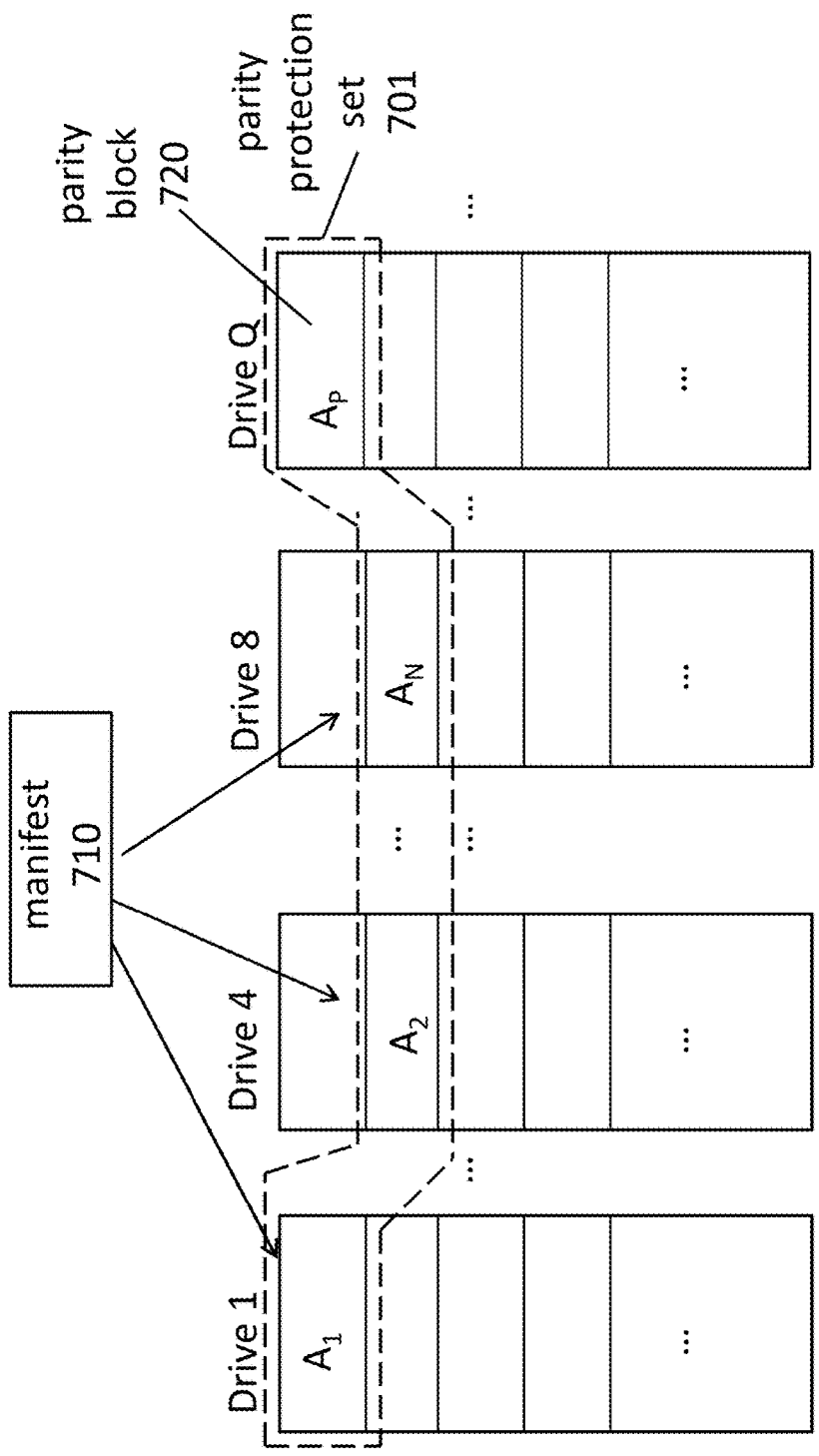
FIG. 7 depicts an embodiment of a parity protection scheme in a distributed storage system.

FIG. 7 illustrates manifest striping system 700. While it has been more common to stripe the content into N data stripes and M parity stripes, the math has always been just as consistent with adding M parity chunks to protect N payload chunks. The parity chunks are derived from the payload chunks. There is nothing in that formula which requires the parity chunks to be derived when the payload chunks are initially written.

In the example of FIG. 7, a chunk $A_1$ is stored on Drive 1, a chunk $A_2$ is stored on Drive 4, and a chunk $A_N$ is stored on Drive 8. These chunks are referenced by manifest 710, which is a manifest for a version of an object. A storage server performs parity calculations on the chunks using known parity algorithms such as the XOR algorithm, and stores the parity result as parity block 720 (labeled $A_P$) on Drive Q. Notably, parity block 720 can be calculated at the time the chunks are initially stored, or at any time thereafter (such as when data is switched from a replica scheme to a parity scheme). The chunks and parity block 720 together constitute parity protection set 701, which also can be referred to as a manifest stripe.

In the example of FIG. 7, the chunks used to create parity protection set 701 are all associated with a single manifest, manifest 710. However, the same technique can be used to protect chunks associated with multiple manifests (for instance, manifests 711, 712, . . . ). Under a first option, the multiple manifests can be related to one another, for example, if they are manifests for different versions of the same object. This would be efficient because different versions of the same object often will use the same payload chunks (as some data has not changed from version to version). Under a second option, the multiple manifests can be unrelated to one another, so that the chunks represent portions of different objects.

The present invention allows re-use of existing payload chunks when switching from a replica to parity system, while updating back-references associated with each payload chunk so that the system will know which replicas must be retained. This is specifically targeted for fully distributed storage clusters, such as disclosed in the Incorporated References, which do not retain a centralized database of which payload chunks are referenced by which objects, and is more fully discussed below with reference to FIGS. 11A, 11B, and 11C.

Specifically, the method disclosed for generating parity protection for already stored data is optimized to retain only one of the existing whole replicas for each chunk and to place each parity protection chunk in a different failure domain (e.g., in storage devices accessed by different storage servers) for each parity protection set (such as stripe 701). The new parity protection chunks are created and referenced without requiring the existing metadata chunks to be modified. The now excess replicas of the protected chunks will no longer have retaining back-references to prevent their deletion when storage space is required.

Parity protection is added to the content references using an existing manifest by creating a parity protection content manifest (PPCM). This is an additional manifest that piggybacks on the identity of the manifest itself. The technique of adding additional attributes in a key-value store is disclosed in the Incorporated References. The key for accessing the PPCM is "PPCM +Manifest–CHIT" rather than "Manifest +Manifest–CHIT." There is no need to access the PPCM for a normal get operation unless one of the referenced chunks cannot be retrieved.

Parity Protection Content Manifest

A version or content manifest may also be extended to add parity protection to existing content. This enables reducing the effective replica count imposed on all of its chunks by the object version. The existing manifest is extended by creation of a parity protection content manifest which is encoded as an alternate fork of the manifest by assigning a different type to it while retaining the original chunk identifier.

Figure 8:
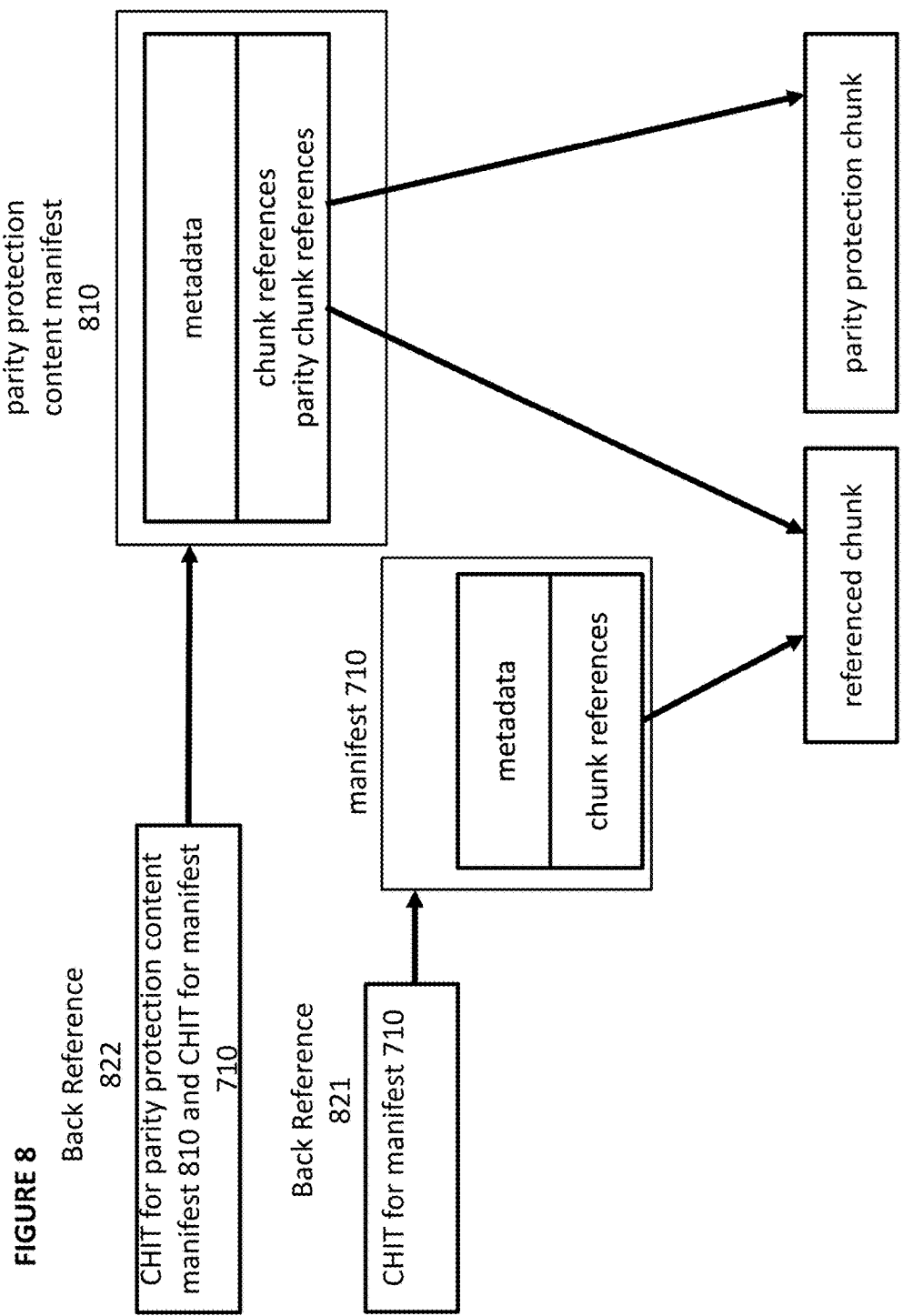
FIG. 8 illustrates how different index entries reference both a manifest and a parity protection content manifest which describes the parity protection of referenced chunks.

FIG. 8 illustrates two different indexes related to the same set of chunks: the first is through the normal manifest 710, the second is through the alternate parity protection content manifest 810.

With reference to FIG. 8, the parity protection content manifest (PPCM) 810 is an alternate KVM encoded additional parity protection information for a manifest 710. The PPCM 810 augments, but does not replace, the original manifest 710. It provides information that can restore lost chunks referenced in the manifest. Because it is an alternate KVM, the PPCM 810 can be created or updated at any time after manifest 710 is created (such as when converting from a replica system to a parity system for the chunks references by manifest 710).

It is advantageous to reduce the storage required for data protection once a given object version is older and less likely to be referenced. This is desirable when performance-optimizing the "hot" 1-10% of the content by keeping it protected by multiple replicas. Reducing the raw storage required is more valuable for the "cold" 90-99%.

As illustrated in FIG. 9, PPCM 810 encodes one or more manifests (such as manifest 710), in the context of the Incorporated References these can be either a content manifest or version manifest. For each manifest, PPCM 810 encodes an array of parity protection sets, such as parity protection set 701. Each parity protection set (such as parity protection set 701) can be used to recover at least one of the source chunks enumerated for the set. Certain parity algorithms may enable recovery from the loss of more than one chunk.

PPCM 810 encodes multiple parity protection sets (such as parity protection set 701) so that no parity protection set references two chunks in a single failure domain (for example, where the chunks are stored by different storage servers). Chunks stored in a single failure domain are at risk of correlated failures, which would undermine the data protection.

Each parity protection set specifies a set of source chunks using source chunk references 920 and a set of parity chunks through parity chunk references 930.

For each of the source chunks and parity chunks referenced, the following is specified:

The chunk identifier. This must uniquely identify the chunk outside of the context of the original manifest even if the content is migrated due to background maintenance or load-balancing. In the context of the Incorporated References, this would include the Indivisible Negotiating Group (ING) and the Chunk Identifying Token (CHIT).

Failure domain that is required to retain this chunk.

The length of the chunk. For compressed chunks, this is the actual length of the compressed chunk, not the logical length that is used in the chunk reference.

For source chunks, the chunk identifier and failure domain exist before the parity protection set. For parity chunks, the parity protection set prescribes that a parity chunk is to be generated within a specific failure domain, which loosely determines target negotiating group. The chunk identifier of the parity chunk is only available after the parity chunk is created, so it will be recorded when available.

If the parity protection set comprises multiple parity chunks (as with RAID-Zn or Erasure Encoding) the specific role of each parity chunk must be noted, such as through protection algorithm field 910.

The preferred parity algorithm is a simple XOR. A parity protection chunk generated with this algorithm would XOR all the referenced chunks. Any chunk with a compressed length less than the largest chunk in the set is logically zero padded. A lost chunk (such as might occur when a disk drive fails) can be restored by XORring the surviving source chunks and the parity protection chunk. The length of the parity protection chunk will therefore be equal to the length of the longest existing data chunk (maybe rounded up to an alignment boundary, as required by specific algorithm). The explicit length in the PPCM 810 is then used to restore (truncate) the chunk to its proper length. Without the explicit length the restored chunk would have retained the zero padded extension.

Implementations may elect to use more complex parity protection algorithms. Examples would include the RAID- Z2 or RAID-Z3 algorithms such as used in the ZFS file system, or any erasure encoding algorithm.

A PPCM 810 must include a sufficient set of parity protection sets such that:

- Every chunk referenced in the version manifest is referenced in at least one parity protection set.
- No parity protection set references two chunks in a single failure domain.
- A single chunk may be included in multiple parity protection sets to provide protection against the concurrent loss of more than one chunk. However, when a chunk is included in more than one parity protection set it should be the only common member of the sets.

Two methods may be combined to provide protection against concurrent loss of multiple chunks:

- To protect against the concurrent loss of n chunks: ensure that each chunk is included in at least n parity protection sets that have no other common source chunks.
- Within a single parity protection set, use additional parity algorithms, such as RAID-Z2 and RAID-Z3, which can recover from the loss of n concurrent chunks. RAID-Z2 protects against the concurrent loss of 2 chunks, while RAID-Z3 protects against the loss of 3 chunks. A Reed-Solomon N of M encoding can protect against the loss of M-N chunks.

The ultimate goal of creating parity protection chunks is to reduce the number of whole replicas required. In the object storage system disclosed in the Incorporated References chunks are retained on each storage server because they have associated back-references in a back-reference KVT tuple. A typical back-reference encodes a reference to the referencing manifest and the replication count required of this chunk by this manifest. The default effective replication count for a chunk is the maximum of the required replication counts across all of its back-references.

The present invention replaces the back-references on each of the whole replicas of a chunk with a single back-reference on the replica in a designated failure domain that requires retention of that chunk within that specific failure domain.

Chunks Replicated to the "Wrong" Failure Domains

It should be noted that the failure domains noted in the parity protection sets specify the preferred location for each chunk. The surviving members of any parity protection set may be used to restore the missing members even if they are not stored on the preferred failure domains. Retaining the chunks on the preferred failure domains will maintain the statistical independence of the chunks and therefore maximize the probable survivability of the entire set. Inevitable replacement of storage servers may temporarily place chunks on the same failure domains. This is undesirable and should be corrected as promptly as possible, but the parity protection set can still be used to recover missing chunks during this interim state.

Protecting Sets of Manifests

When there is a group of manifests which reference many of the same chunks, it is advantageous to calculate a single parity protection content manifest 810 for the entire set of manifests. This will be common with objects that are edited documents, or when objects are cloned.

Any set of manifests can be referenced in a single parity protection content manifest. For example the motivation could also be to increase the number of unique chunks to be assigned to parity protection sets.

Any method of enumerating a set of parity protection sets that provides the required level of protection for each chunk directly referenced by the manifests in question may be used.

One method for enumerating parity protection sets for a set of manifests would be as follows:

- Enumerate the failure domains where each referenced payload chunk is stored by querying the negotiating group that holds that chunk. The query response also includes the list of back-references for the chunk.
- Form a list of unique directly referenced payload chunks. References to other manifests are not included. The effective replica count for manifests are never reduced from the original.
- Create a n-dimensional cube, assign each unique failure domain to one of the cells.
- Assign each chunk referenced to a cell in the n-dimensional cube matching one of the failure domains, preferably load-balancing the cells. The simplest algorithm for doing this is to assign each chunk serially to the cell which currently has the fewest chunks assigned.
- For each row/column/spire in the n-dimensional cube, select the cells by varying only a single of the dimensional co-ordinates. For example, for a 2 dimensional "cube" (a square) select each row and then each column. For each of these parity protection sets:
  - Identify at most one insufficiently protected chunk from each of the selected cells.
  - Add the identified chunk to the parity protection set.

After each parity protection set is identified (by the above or any other algorithm):

- Create and then execute a computational map specifying which nodes will perform the specified algorithm on data held locally and received from another node, and where the results are sent. The computational map will be explained and illustrated in a later section. In the context of the Incorporated References, the storage server selected to store each parity protection chunk can be selected using the normal put transaction as long as the target selection process is extended to exclude storage servers and/or devices in failure domains already referenced in the parity protection set.

The following must be recorded about each parity protection chunk generated for a parity protection set:

- When the algorithm generates multiple chunks, such as a Reed-Solomon code or RAID-Zn, which parity chunk is this? For example, with RAID-Zn is this p, q or r?
- What is the identifying token (CHIT) for this chunk?
- If there is location confining data for this chunk that is not implied by the CHIT, such as an explicit negotiating group in the replicast protocol, what is that limiting scope.
- What is the failure domain that must retain this parity protection chunk?
- Write the PPCM KVT for one of the manifests originally selected on each server where that Manifest is already stored. This is the primary manifest for the PPCM.
- Write an alias PPCM KVT referencing the primary manifest's CHIT on each server where these other manifests are stored.

For all chunks that are now part of a parity protection set change the effective replica count communicated in the verified back-reference from each manifest referencing it to an encoding which means "only one required but it must be in failure domain X." Assignment of storage servers to failure domains is beyond the scope of the present application. The present invention relies on each storage server to report its assigned failure domain as an integer. If two failure domain codes are identical, then they are the same failure domain, otherwise the servers are in different failure domains.

FIG. 10 illustrates the end result of an exemplary operation that starts with four chunks with three replicas each and ending with four chunks with only a single retained replica but now protected by two parity chunks in different failure domains. While not shown in FIG. 10, it should be remembered that the replication counts on the manifests have not been reduced.

Figure 11A:
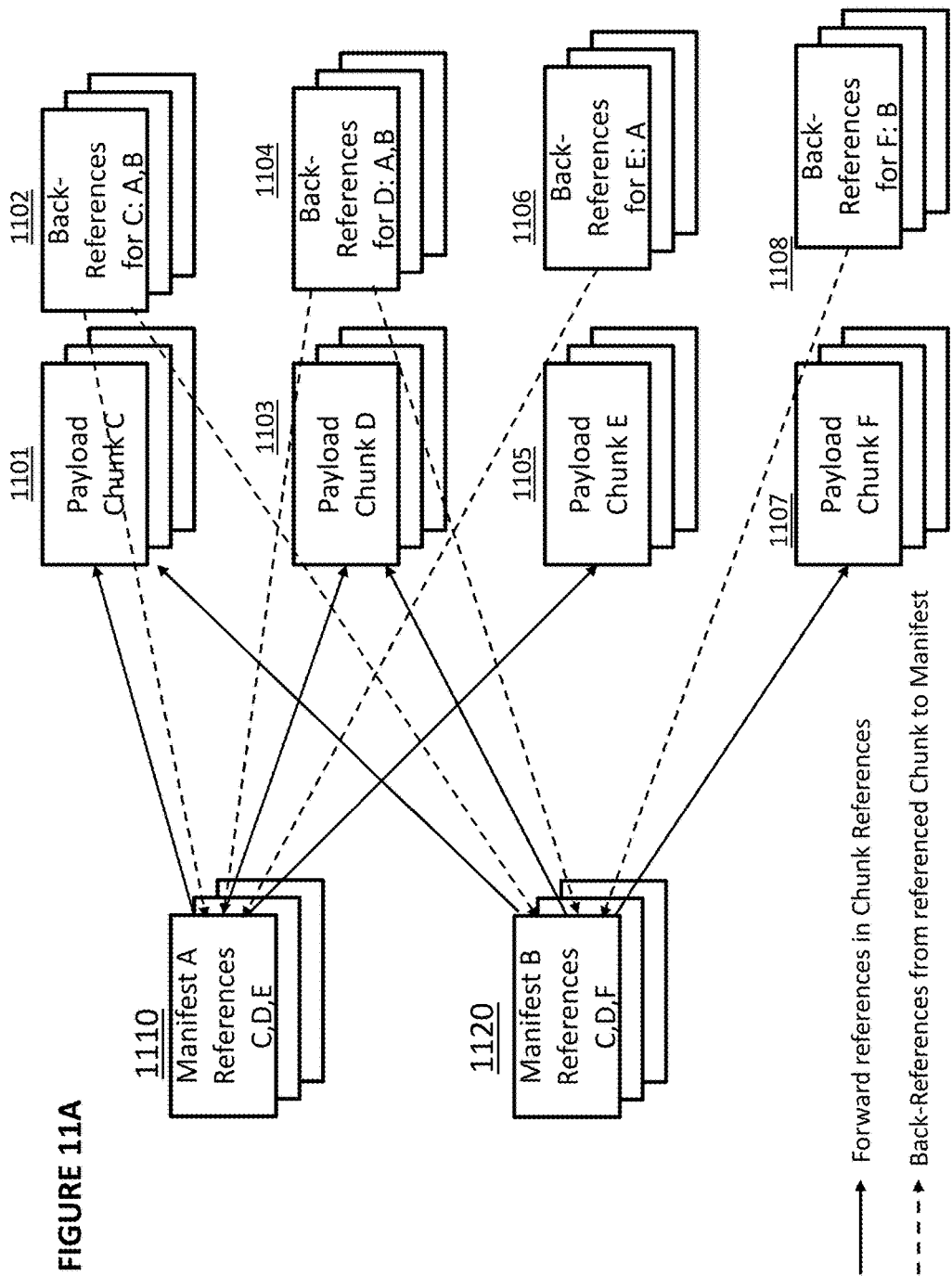
FIGS. 11A, 11B, and 11C depict a replica system that transitions to a parity system and back to a replica system.
Figure 11B:
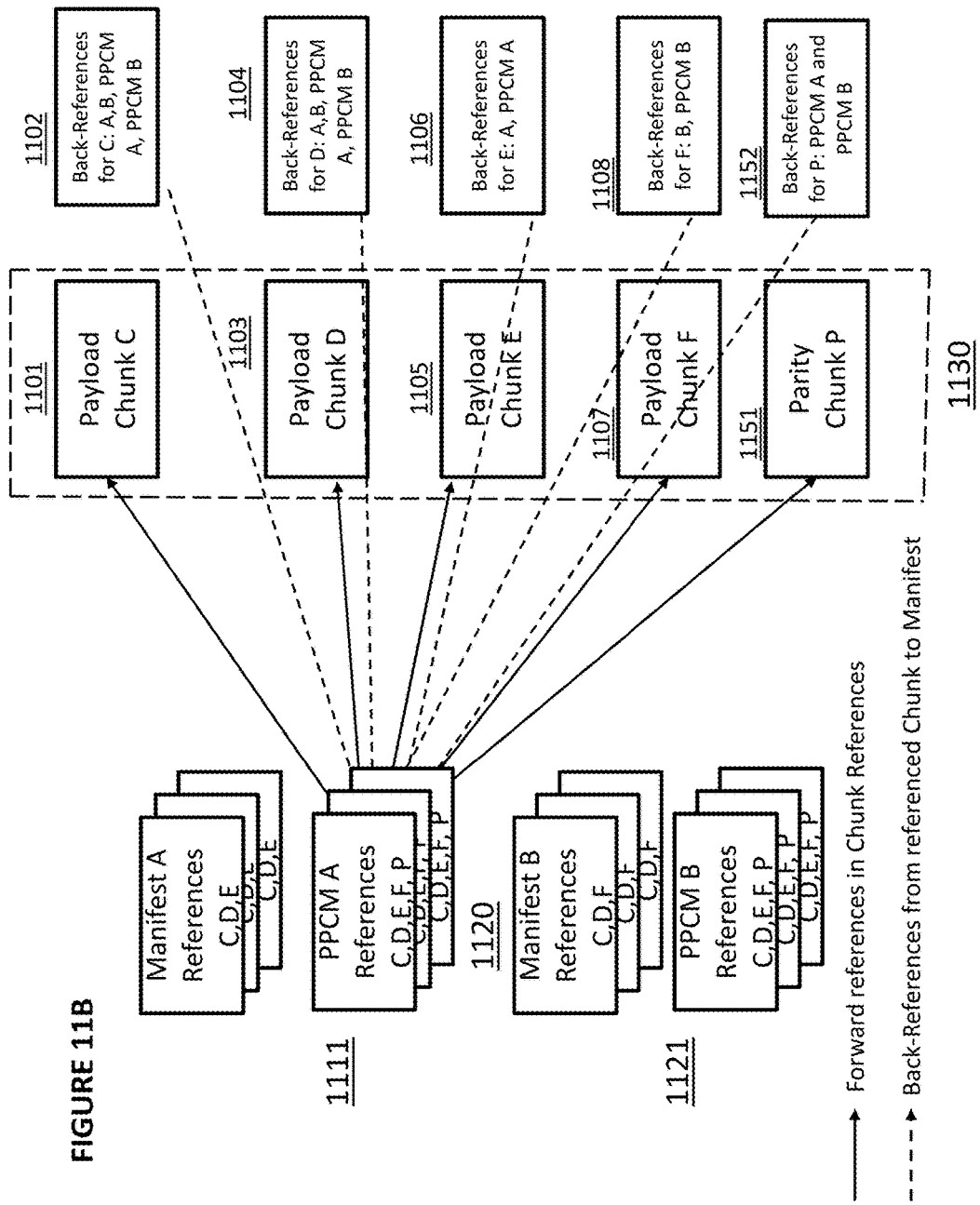
Figure 11C:
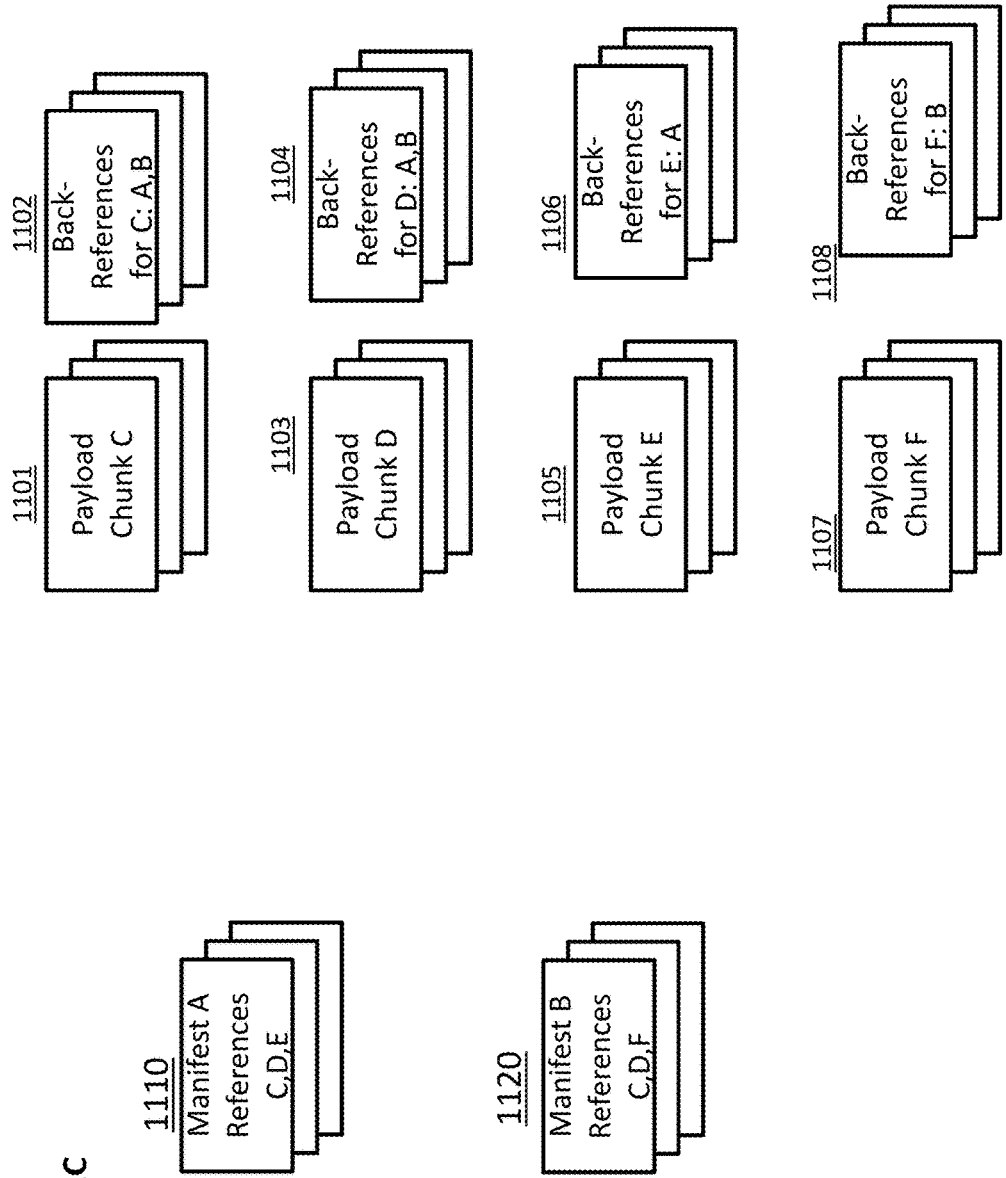

An additional example of a storage system following a replica technique that then transitions to a parity technique and then back to a replica technique is shown in FIGS. 11A, 11B, and 11C.

FIG. 11A depicts a replica technique for various chunks. Manifest 1110 (labeled as Manifest A) refers to payload chunks 1101, 1103, and 1105 (labeled Payload Chunks C, D, and E), and manifest 1120 (labeled as Manifest B) refers to payload chunks 1101, 1103, and 1107.

It is common for different manifests to refer to some of the same payload chunks when the underlying objects are related, as might be the case when they are portions of two versions of the same file. In this particular example, perhaps manifest 1110 is associated with a first draft of a word processing document, and manifest 1120 is associated with a second draft of the same word processing document, and payload chunks 1101 and 1103 are the portions of the document that have not changed from one version to the next.

In this example, manifest 1110 has three replicas (represented by the two additional boxes underneath the box for manifest 1110). Payload chunks 1101, 1103 and 1105 also have three replicas each (represented by the boxes underneath each payload chunk). The relationships between manifests and referenced chunks are between the conceptual chunks, not between the specific replicas. The second replica of Manifest 1110 has chunk references to payload chunks 1101, 1103 and 1105. These same references are in the first and third replica of Manifest 1110. The chunk references specify the chunk IDs of payload chunks 1101, 1103 and 1105. The reference does not specify a specific replica or any specific location.

There are back-reference lists associated with each of the payload chunks. These back-references are to the manifest chunk by its chunk ID. They do not reference a specific replica.

With reference to FIG. 11B, when it is desirable to switch from a replica system to a parity system for this particular data set (such as for the reasons described with respect to FIG. 12, below), the effective replication count for manifests are not altered. Therefore, there will still be three replicas of each of the manifest chunks. There will also be whole replica protection for the parity protection content manifests. A back-reference from each created parity protection chunk references the chunk ID of the parity protection content manifest. This prevents the parity protection chunk from being expunged while it is referenced in a parity protection content manifest.

With reference to FIG. 11C, when it is desirable to switch from a parity system to a replica system for this particular data set (such as for the reasons described with respect to FIG. 12, below), the effective replication count from the manifest to the referenced payload chunks will be restored to the number of whole replicas desired. This will cause the storage servers to begin replicating the whole referenced payload chunks until there are the desired number of whole replicas. Concurrently, the parity protection content manifest may be expunged after the parity protection chunks are no longer required to protect the object version's payload from the designated number of target losses. Alternately, an implementation may elect to retain the parity protection even while carrying full replica protection if return to parity protection is anticipated to occur relatively soon.

Figure 12:
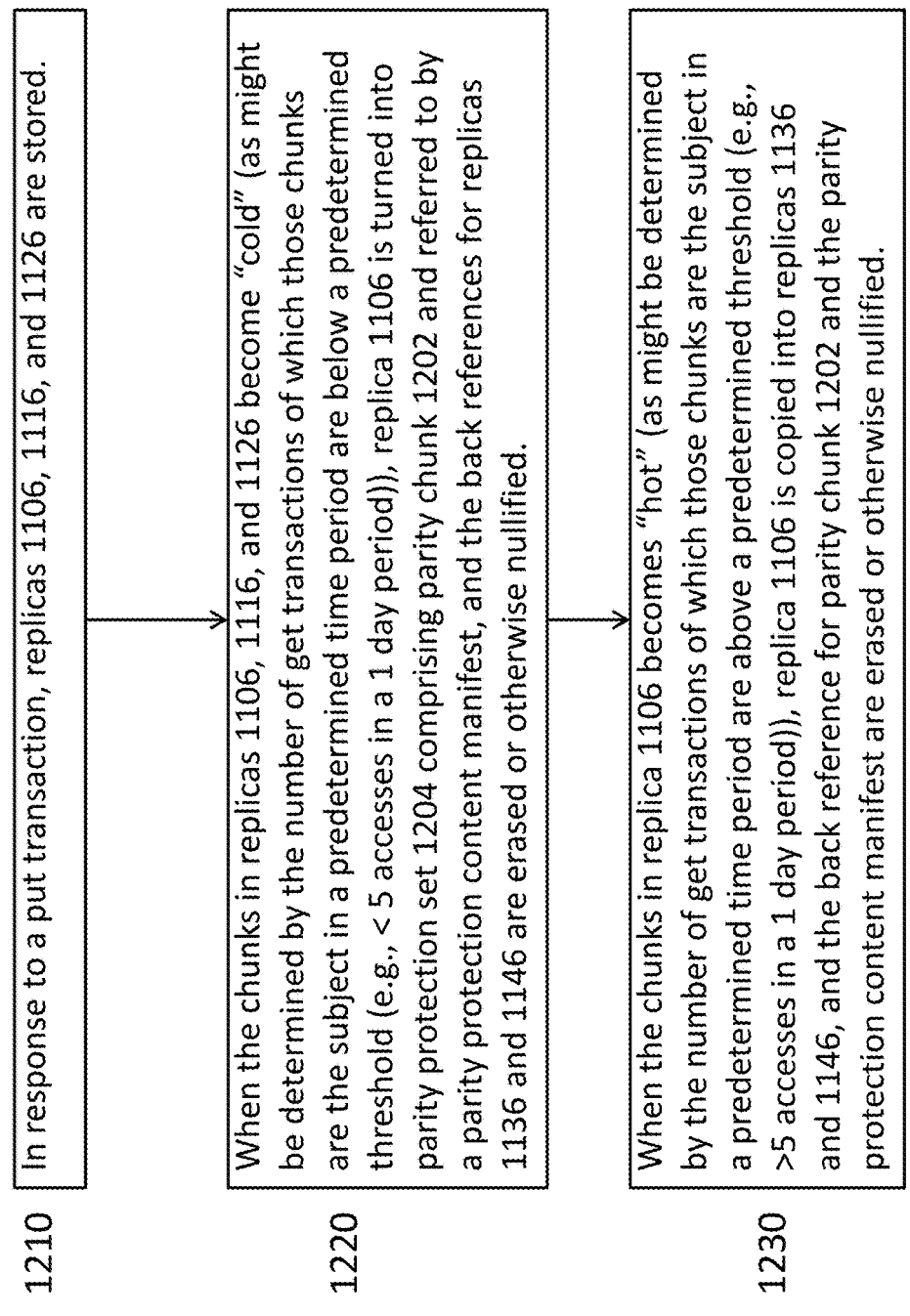
FIG. 12 depicts a method of transitioning from a replica technique to a parity technique and back to a replica technique.

With reference to FIG. 12, a method 1200 for transitioning between replica and parity techniques for a given data set is depicted. In response to a put transaction, replicas 1106, 1116, and 1126 are stored (step 1210). When the chunks in replicas 1106, 1116, and 1126 become "cold" (as might be determined by the number of get transactions of which those chunks are the subject in a predetermined time period are below a predetermined threshold (e.g., <5 accesses in a 1 day period)), replica 1106 is turned into parity protection set 1204 comprising parity chunk 1202 and referred to by a parity protection content manifest, and the back references for replicas 1136 and 1146 are erased or otherwise nullified (step 1220). When the chunks in replica 1106 becomes "hot" (as might be determined by the number of get transactions of which those chunks are the subject in a predetermined time period are above a predetermined threshold (e.g., >5 accesses in a 1 day period)), replica 1106 is copied into replicas 1136 and 1146, and the back reference for parity chunk 1202 and the parity protection content manifest are erased or otherwise nullified (step 1230).

It should be understood that giving parity protection to a payload chunk does not actively erase the excess replicas. Rather it removes the back-references which encode the need to retain the excess replicas. Assuming that the storage cluster has not been severely over-provisioned this will eventually lead to the excess replicas being removed.

In the example discussed above (with a replication count of three), we transition from a state where an object is represented as the following:
1) At least three replicas of the Version Manifest for the object version.
2) At least three replicas of each referenced payload chunk.

The end result is a state where the same object is represented as:
1) At least three replicas of the Version Manifest for the object version.
2) Alternate KVM parity protection content manifests co-resident on the same storage devices as the Version Manifests.
3) At least one replica of each protected payload chunk which should be in the designated failure domain.
4) At least one parity protection chunk for each parity protection set in the parity protection content manifest where the parity protection chunk is designated for a failure domain that is different from any of the designated failure domains for the payload chunks it is protecting.

Another example of transitioning an object from replica protection to parity protection is presented in the following tables. Each cell of a table represents a specific storage server and enumerates the relevant KVTs for a specific object version.

Table 1 shows a single object ("A") represented by a Version Manifest ("M1") and two payload chunks ("C1" and "C2"). The replica count is three. There are three storage nodes with replicas of M1. There are three storage nodes with replicas of C1 and C2. The storage nodes holding C1 and C2 also hold back-reference KVTs to M1.

TABLE 1

Object A encoded as M1, C1 and C2 with replica protection

| M1: Refs to C1, C2 | C2 Back-ref-C2: M1 | | | |
|---|---|---|---|---|
| | | | C1 Back-ref-C1: M1 | |
| C1 Back-ref-C1: M1 | | M1: Refs to C1, C2 | | C2 Back-ref-C2: M1 |
| | | | M1: Refs to C1, C2 | |
| | | C1 Back-ref-C1: M1 | | |
| C2 Back-ref-C2: M1 | | | | |

Table 2 illustrates the addition a a Parity Protection Chunk (P1) which has XORed C1 and C2. This must be on a different failure domain than is planned for retention of C1 or C2.

TABLE 2

Create Parity Protection Chunk P1

| M1: Refs to C1, C2 | C2 Back-ref-C2: M1 | | | |
|---|---|---|---|---|
| | | | C1 Back-ref-C1: M1 | |
| C1 Back-ref-C1: M1 | | M1: Refs to C1, C2 PI: C1^C2 | M1: Refs to C1, C2 | C2 Back-ref-C2: M1 |
| | | C1 Back-ref-C1: M1 | | |
| C2 Back-ref-C2: M1 | | | | |

Table 3 illustrates the addition of a parity protection content manifest (PPCM+M1) which includes a single parity protection set identifying C1, C2 and P1. The PPCM is an alternate KVT created parallel to each replica of M1.

TABLE 3

Create Parity Protection Content Manifest

| M1: Refs to C1, C2 PPCM + M1: C1, C2, P1 | C2 Back-ref-C2: M1 | | | |
|---|---|---|---|---|
| | | | C1 Back-ref-C1: M1 | |
| C1 Back-ref-C1: M1 | | M1: Refs to C1, C2 PPCM + M1: C1, C2, P1 P1: C1^C2 | M1: Refs to C1, C2 PPCM + M1: C1, C2, P1 | C2 Back-ref-C2: M1 |
| | | C1 Back-ref-C1: M1 | | |
| C2 Back-ref-C2: M1 | | | | |

Table 4 illustrates the updating of back-references for C1 and C2. The existing back-reference is either deleted or replaced with a back-reference to the PPCM.

TABLE 4

Updated Back-References

| M1: Refs to C1, C2 PPCM + M1: C1, C2, P1 | C2 | | | |
|---|---|---|---|---|
| | | C1 | | |
| C1 | | M1: Refs to C1, C2 PPCM + M1: C1, C2, P1 P1: C1^C2 | M1: Refs to C1, C2 PPCM + M1: C1, C2, P1 | C2 Back-ref-C2: PPCM-M1 |
| | | C1 Back-ref-C1: PPCM-M1 | | |
| C2 | | | | |

Lastly, Table 5 illustrates the cluster after the excess replicas of C1 and C2 have been expunged because the storage resources were needed to store other chunks.

TABLE 5

After excess replicas have been expunged

| M1: Refs to C1, C2 PPCM + M1: C1, C2, P1 | | | | |
|---|---|---|---|---|
| | | M1: Refs to C1, C2 PPCM + M1: C1, C2, P1 P1: C1^C2 | M1: Refs to C1, C2 PPCM + M1: C1, C2, P1 | C2 Back-ref-C2: PPCM-M1 |
| | | C1 Back-ref-C1: PPCM-M1 | | |

Example of Dual Protection with Just Simple Parity

More specific parity schemed can be used. If we work with an "n-dimensional cube" that is a 6×6 square (2 dimensions), then we could end up with 36 chunks each assigned to once cell in the 6×6 square. This represents perfect load-balancing, but that is a goal of the storage cluster. If we label these chunks as C01 thru C36 we would then end up with the following set of parity protection sets:

C01,C02,C03,C04,C05,C06
C07,C08,C09,C10,C11,C12
C13,C14,C15,C16,C17,C18
C19,C20,C21,C22,C23,C24
C25,C26,C27,C28,C29,C30
C31,C32,C33,C34,C35,C36
C01,C07,C13,C19,C25,C31
C02,C08,C14,C20,C26,C32
C03,C09,C15,C21,C27,C33
C04,C10,C16,C22,C28,C34
C05,C11,C17,C23,C29,C35
C06,C12,C18,C24,C30,C36

Each chunk is protected by two different parity protection sets with no overlapping members.

The row/column method uses is just one method of generating sets of non-overlapping parity protection sets.

Partial Edits

An embodiment of the present invention may wish to retain the parity protection status for unmodified portions of a new object version. The normal procedures for putting each chunk of the new version manifest, even if it is known to be unmodified, protects against the chunk being released before the verified back-reference for the new object version can be created. However, this would have the effect of promoting the entire replica from parity protection to whole replica protection.

When this is not desirable an initiator may refrain from creating the new replicas for unmodified chunks after receiving the single "Chunk Exists" response from the single storage server holding the parity protected chunk. The verified back-reference eventually issued would then reference the new manifest but retain the "must be retained in at least this failure domain" value.

Alternately, the initiator performing a partial edit could apply a speculative hold to the referenced version manifest. This speculative hold would prevent that version manifest from being expunged any time before new verified back-references would be fully created. The put transactions for the retained chunks would no longer be needed. Even though there would be no speculative hold for these chunks, the verified back-reference from the prior version would be protected by the speculative hold on that version manifest.

Repairing a Lost or Unavailable Chunk

When an initiator fails to retrieve a parity protected chunk (as might occur when a disk drive fails), the system can recreate the chunk using a parity protection content manifest 810 as follows:

Retrieve the parity protection content manifest 810 associated with the CHIT of the manifest 710 that drove the failed chunk retrieval.

Find the parity protection sets which include the chunk that could not be retrieved.

Select one of the parity protection sets which is believed to have sufficient intact chunks to allow the missing chunk to be retrieved. First preference should be given to sets that have no other missing chunks.

Build and execute a computational map which will deliver the rebuilt chunk to the initiator. If this fails, retry with another parity protection set.

Deliver the rebuilt chunk to the application layer.

Put the rebuilt chunk to the cluster.

The procedure for recovering a lost parity protection chunk is the same as for recovering a parity protected chunk.

FIG. 8 illustrates how both a manifest and a parity protection content manifest can reference the same source chunks and are indexed using the manifest's identifying CHIT.

Scrubbing Chunks on Storage Servers

A storage server may perform a scrub operation, optionally as a background operation, to validate the chunks it has stored. When it determines that a stored chunk has been damaged (because the calculated cryptographic hash does not match the identity of the chunk) and the back-references for the chunk indicate that there should be no other replicas, the parity protection mechanism must be applied to rebuild the chunk.

With this style of background scrub there is no manifest driving the access to the damaged chunk. A manifest must be identified that references the damaged chunk. This is done by starting with the manifest referenced in the back-reference. The chunk is then recovered as though it had been referenced using this manifest. If chunk is referenced in multiple manifests, it will have multiple back-references and the scrub algorithm may use any one, or try each of them either in parallel or serially.

Maintaining PPCMs after Chunk Recovery

PPCM 810 enables recovery of lost chunks, but it temporarily must enforce a specific failure domain for each chunk in a parity protection set so that it can guarantee that there are never two chunks in the same failure domain.

Maintaining that relationship when restoring a lost drive may be problematic. There may not be a non-conflicting failure domain immediately available to host a recovered chunk.

When such a problem exists, a method that may be used to address this problem is as follows:

Rebuild the lost chunk with its default replication count in the same negotiating group where it is currently referenced.

Queue the version manifest to rebuild its parity protection content manifest. The rebuild process should retain as many of the current parity protection sets as possible, but it may be necessary to change some failure domain assignments because the chunks lost on a single server will typically be dispersed to multiple servers. This can be done by determining which parity protection sets can be retained, and then starting the already described algorithm moving forward from that point.

Rewrite the parity protection content manifest after the new contents and their failure domains are determined.

Change the effective replication counts for the referenced chunks just as is done when the PPCM 810 is initially created. However, this process should be optimized for the vast majority of chunks where no change to their back-references are required.

Computational Maps

The present invention requires that parity protection chunks be generated and that surviving chunks be used to recreate lost chunks. When Galois transforms, such as XOR, are used, these are actually the same algorithm.

It is advantageous for a distributed storage cluster to perform this calculation in a distributed fashion leveraging parallel processing.

Figure 13:
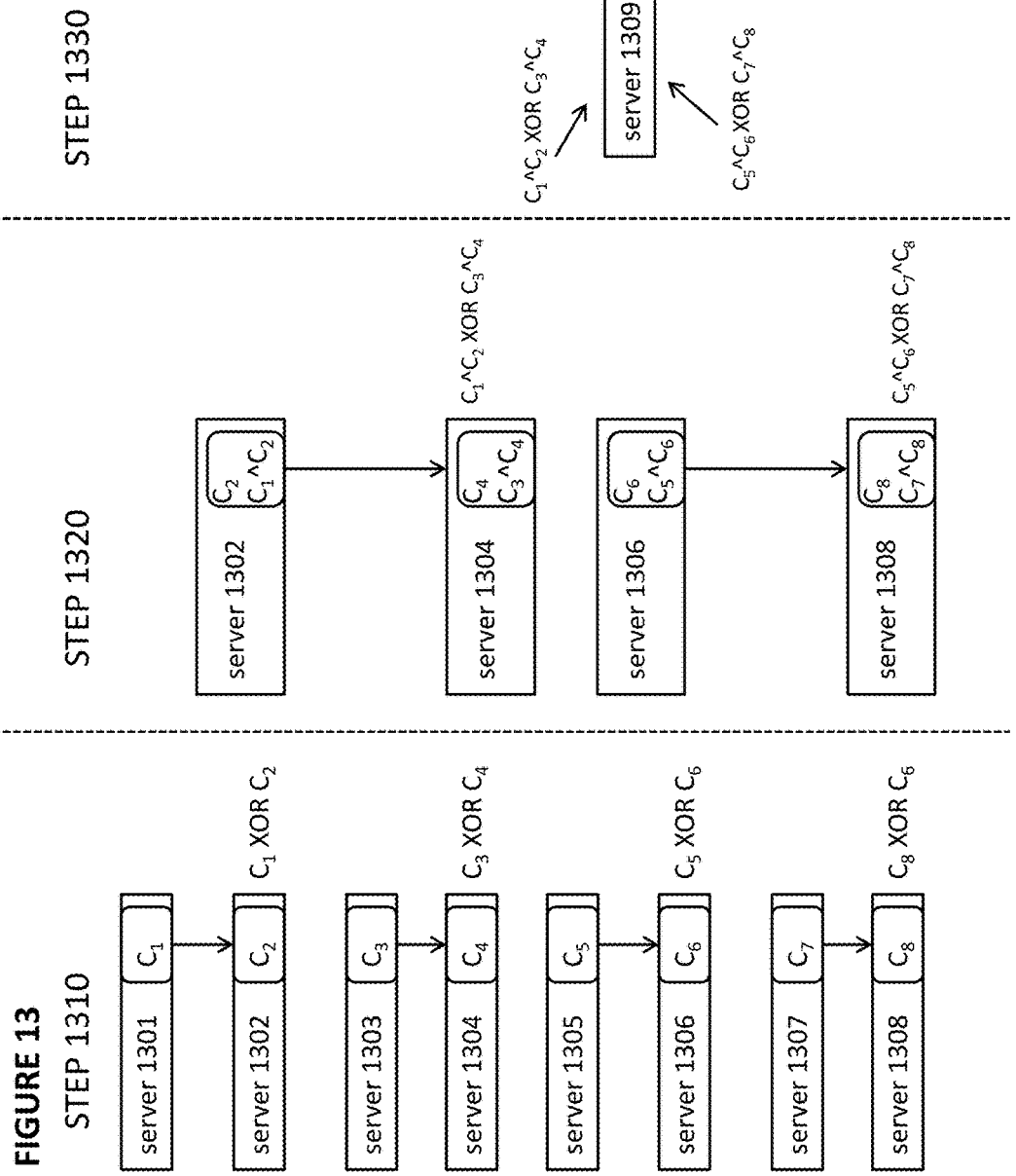
FIG. 13 depicts the computation of parity using distributed servers.

FIG. 13 depicts an example of a parity of 8 chunks stored on 8 different servers achieved in three steps:

Step 1310:
server 1301 sends C1 (where Cn is a bit or array of bits within a chunk) to server 1302, which XORs it with C2.
server 1303 sends C3 to server 1304, which XORs it with C4.
server 1305 sends C5 to server 1306, which XORs it with C6.
server 1306 sends C7 to server 1308, which XORs it with C8.

Step 1320:
server 1302 sends C1^C2 to server 1304, which XORs it with C3^C4
server 1306 sends C5^C6 to server 1308, which XORs it with C7^C8

Step 1330
server 1304 sends C1^C2^C3^C4 to the final destination (server 1309)
server 1308 sends C5^C6^C7^C8 to the final destination (server 1309)
The final destination (server 1309) XORs them to get C1^C2^C3^C4^C5^C6^C7^C8, which yields the parity bit P.

This combines 8 chunks in only three steps. The total work performed is the same as with a serial calculation, but the early stages do multiple transfers and calculations in parallel. This allows the final result to be completed earlier.

This technique is applicable with any Galois transform, of which XOR is the simplest example.

For more complex transformations a serial computational map can specify a set of serial steps. Each step can receive intermediate results from the prior step (or can start the pipeline by referencing an already stored chunk). Each pipeline step combines its inputs to produce the next chunk. This next chunk can be fed to the next pipeline step or stored as a final result.

A serial computational map would be required to apply many cryptographic hashes covering all payload chunks. Performing the steps serially across multiple machines will generally be preferable to requiring all chunks be assembled at one location so that the steps can be performed serially on a single processor. The latter approach is used in most Erasure Coding and RAID-recovery implementations.

What is claimed is:

1. A method of generating a parity protection set in a distributed storage system containing a plurality of replicas of payload chunks, each of the replicas of payload chunks associated with a back-reference to one or more content manifests, the method comprising:
   selecting a content manifest to be protected;
   selecting a subset of all payload chunks referenced by the content manifest, wherein the subset is generated based on failure domain information;
   generating one or more parity chunks using the subset of payload chunks;
   generating a parity protection content manifest that refers to the parity protection set comprising the subset of payload chunks and the one or more parity chunks;
   generating and storing a back-reference for the replica cited in the parity protection set for each payload chunk, wherein the back-reference is to the parity protection content manifest; and
   erasing each back-reference to the content manifest for all remaining replicas of the subset of payload chunks, thereby enabling storage space in which the remaining replicas are stored to be used for future put requests.

2. The method of claim 1, wherein the parity protection content manifest comprises one or more parity protection sets, each specifying a set of protected payload chunks, where for each protected payload chunk the following is specified:
   an identifier for the protected payload chunk, including any scoping identifier which will optimize retrieval of this chunk;
   an identifier for a failure domain where the protected payload chunk will be retained; and
   the original length for the protected payload chunk.

3. The method of claim 2, wherein the parity protection set further comprises:
   an identifier of an algorithm used to generate each of the one or more parity protection chunks;
   an identifier for each parity protection chunk, including any scoping identifiers required to optimize retrieval of the parity protection chunk; and
   an identifier for a failure domain where the parity protection chunk will be retained.

4. The method of claim 3, wherein each protected payload chunk and each parity protection chunk in the parity protection set are assigned to separate failure domains.

5. A method of generating a plurality of parity protection sets, the method comprising: performing the method of claim 1 for a plurality of content manifests.

6. A method of generating a parity protection set in a distributed storage system containing a plurality of replicas of payload chunks, each of the replicas of payload chunks associated with a back-reference to one or more content manifests, the method comprising:
   identifying a content manifest to be protected;
   identifying a subset of all payload chunks referenced by the content manifest, wherein the subset is generated based on failure domain information;
   generating one or more parity chunks using the subset of payload chunks;
   generating a parity protection content manifest that refers to the parity protection set comprising the subset of payload chunks and the one or more parity chunks;
   generating a back-reference for the replica cited in the parity protection set for each payload chunk, wherein the back-reference is to the parity protection content manifest;
   erasing each back-reference to the content manifest for all remaining replicas of the subset of payload chunks, thereby enabling storage space in which the remaining replicas are stored to be used for future put requests;
   identifying a failure that invalidates a payload chunk in the parity protection set; and
   regenerating the invalidated payload chunk using the remaining payload chunks and the one or more parity protection chunks in the parity protection set.

7. The method of claim 1, wherein the step of generating one or more parity chunks comprising applying a Galois transformation using part or all of the subset of payload chunks.

8. The method of claim 5, wherein the Galois transformation comprises applying an XOR operation to the subset of payload chunks.

9. A method of regenerating one or more invalidated payload chunks in each of a plurality of parity protection sets, the method comprising: performing the method of claim 6 for a plurality of parity protection sets.

10. A method of recovering a payload chunk in a distributed storage system, the method comprising:
    determining that a payload chunk cannot be retrieved or validated in response to a get transaction associated with a content manifest referring to the payload chunk;
    identifying a parity protection content manifest that refers to the payload chunk by using the content manifest or by analyzing back-references associated with the payload chunk;
    selecting a first parity protection set which includes the payload chunk from the parity protection contest manifest;
    attempting to regenerate the payload chunk using other payload chunks in the first parity protection set and one or more parity protection chunks in the parity protection set; and
    if the attempting step fails, repeating the attempting step with other parity protection sets which include the payload chunk until the payload chunk is regenerated.

11. The method of claim 10 further comprising:
    if the payload chunk is not regenerated after performing the attempting step with all parity protection sets containing the payload chunk referred to by the parity protection content manifest, declaring the payload chunk to be permanently lost to a client that initiated the get transaction.

12. A method of updating the retention tracking metadata for a parity protected chunk:
    replace all back-references to the parity protection content manifest with a verified back-reference to the corresponding manifest;

generating one or more replicas of each payload chunk in the set of payload chunks; and for each of the one or more replicas of the payload chunk, generating one or more back-references to the same content manifests referred to by back-references for the payload chunk.

13. A method for generating replica protection for a plurality of payload chunks referenced in a parity protection content manifest, the method comprising: performing the method of claim 12 for each protected chunk referenced in the parity protection content manifest.

14. A method of creating a new version of a parity-protected object in a distributed storage system, comprising:

generating a version manifest for the new version of the parity-protected object, wherein the version manifest refers to one or more payload chunks associated with the parity-protected object;

generating a put request for each of the one or more payload chunks associated with the parity-protected object;

in response to the put request for each of the one or more payload chunks associated with the parity-protected object, creating a speculative hold or extending a speculative hold on the payload chunk; and for each of the one or more payload chunks associated with the parity-protected object, adding a back-reference to the version manifest for the new version of the parity-protected object.

15. A method of creating a new version of a parity-protected object in a distributed storage system, comprising:

generating a version manifest for the new version of the parity-protected object, wherein the version manifest refers to one or more payload chunks associated with the parity-protected object;

generating a put request for each of the chunks representing modified portions of the object, but not initiating put transactions for unmodified retained chunks;

creating a speculative hold on the prior version manifest to prevent the prior version manifest from being expunged until the process of protecting the retained chunks has been completed; and for each of the one or more payload chunks associated with the parity-protected object, adding a back-reference to the version manifest for the new version of the parity-protected object.

\* \* \* \* \*